US010037797B2

United States Patent
Tang et al.

(10) Patent No.: US 10,037,797 B2
(45) Date of Patent: **\*Jul. 31, 2018**

(54) PROGRAMMING MEMORIES WITH STEPPED PROGRAMMING PULSES INCLUDING INHIBITING A MEMORY CELL FOR A PORTION OF A PROGRAMMING PULSE AND ENABLING THAT MEMORY CELL FOR ANOTHER PORTION OF THAT PROGRAMMING PULSE

(71) Applicant: MICRON TECHNOLOGY, INC., Boise, ID (US)

(72) Inventors: Qiang Tang, Cupertino, CA (US); Xiaojiang Guo, San Jose, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 3 days.

This patent is subject to a terminal disclaimer.

(21) Appl. No.: 15/687,710

(22) Filed: Aug. 28, 2017

(65) Prior Publication Data

US 2017/0352409 A1    Dec. 7, 2017

Related U.S. Application Data

(63) Continuation of application No. 14/299,074, filed on Jun. 9, 2014, now Pat. No. 9,767,894.

(51) Int. Cl.
*G06F 12/00*     (2006.01)
*G11C 11/56*     (2006.01)
(Continued)

(52) U.S. Cl.
CPC ........ *G11C 11/5628* (2013.01); *G06F 3/0625* (2013.01); *G06F 3/0659* (2013.01);
(Continued)

(58) Field of Classification Search
CPC ........ G11C 11/5628; G11C 2211/5621; G11C 16/10; G11C 16/0483; G11C 16/3459;
(Continued)

(56) References Cited

U.S. PATENT DOCUMENTS 6,643,188 B2    11/2003    Tanaka et al.
6,888,758 B1     5/2005    Hemink et al.
(Continued)

FOREIGN PATENT DOCUMENTS

WO    2013/103504 A1    7/2013

*Primary Examiner* — Mardochee Chery
(74) *Attorney, Agent, or Firm* — Dicke, Billig & Czaja, PLLC

(57) ABSTRACT

Methods of operating a memory device include applying a programming pulse to a plurality of memory cells selected for programming having an initial portion having a first voltage level and a subsequent portion having a second voltage level less than the first voltage level, inhibiting a particular memory cell of the plurality of memory cells from programming during the initial portion of the programming pulse while a different memory cell of the plurality of memory cells is enabled for programming, and inhibiting the different memory cell from programming during the subsequent portion of the programming pulse while the particular memory cell is enabled for programming.

20 Claims, 14 Drawing Sheets

(51) Int. Cl.
*G11C 16/12* (2006.01)
*G11C 16/04* (2006.01)
*G11C 16/34* (2006.01)
*G06F 3/06* (2006.01)
*G06F 12/02* (2006.01)
*G11C 16/10* (2006.01)

(52) U.S. Cl.
CPC ........ *G06F 3/0688* (2013.01); *G06F 12/0246* (2013.01); *G11C 16/0483* (2013.01); *G11C 16/12* (2013.01); *G11C 16/3459* (2013.01); *G11C 16/10* (2013.01); *G11C 16/3404* (2013.01); *G11C 2211/5621* (2013.01); *G11C 2211/5622* (2013.01)

(58) Field of Classification Search
CPC . G11C 16/3454; G11C 16/12; G11C 16/3404; G11C 2211/5622
USPC .......................................... 711/105; 365/185
See application file for complete search history.

(56) References Cited

U.S. PATENT DOCUMENTS

| | | | |
|---|---|---|---|
| 7,301,812 B2 | 11/2007 | Guterman et al. | |
| 7,324,383 B2 | 1/2008 | Incarnati et al. | |
| 7,839,687 B2 | 11/2010 | Dutta et al. | |
| 7,936,599 B2 | 5/2011 | Roohparvar et al. | |
| 8,064,252 B2 | 11/2011 | Yip | |
| 2004/0066685 A1 | 4/2004 | Choi | |
| 2006/0039198 A1 | 2/2006 | Guterman et al. | |
| 2006/0056239 A1 | 3/2006 | Devin | |
| 2006/0209592 A1* | 9/2006 | Li | G11C 11/5642 365/185.03 |
| 2007/0121386 A1 | 5/2007 | Ho et al. | |
| 2008/0175047 A1 | 7/2008 | Im | |
| 2010/0238731 A1* | 9/2010 | Suh | G11C 16/0483 365/185.17 |
| 2011/0013460 A1 | 1/2011 | Dong et al. | |
| 2011/0019486 A1* | 1/2011 | Jang | G11C 16/0483 365/185.25 |
| 2011/0058424 A1* | 3/2011 | Goda | G11C 11/5628 365/185.19 |
| 2011/0157972 A1* | 6/2011 | Pasotti | G11C 16/0441 365/185.1 |
| 2011/0157977 A1* | 6/2011 | Pasotti | G11C 16/0433 365/185.2 |
| 2013/0163346 A1 | 6/2013 | Shen | |
| 2014/0254288 A1* | 9/2014 | Achter | G11C 7/1039 365/189.11 |
| 2014/0321215 A1* | 10/2014 | Sakui | G11C 16/12 365/185.24 |

* cited by examiner

PROGRAMMING MEMORIES WITH STEPPED PROGRAMMING PULSES INCLUDING INHIBITING A MEMORY CELL FOR A PORTION OF A PROGRAMMING PULSE AND ENABLING THAT MEMORY CELL FOR ANOTHER PORTION OF THAT PROGRAMMING PULSE

RELATED APPLICATION

This Application is a Continuation of U.S. application Ser. No. 14/299,074, titled "PROGRAMMING MEMORIES WITH STEPPED PROGRAMMING PULSES," filed Jun. 9, 2014, now U.S. Pat. No. 9,767,894 issued on Sep. 19, 2017, which is commonly assigned incorporated herein by reference.

TECHNICAL FIELD

The present embodiments relate generally to memory devices and a particular embodiment relates to programming in memory devices.

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a string of memory cells is coupled in parallel with each memory cell coupled to a data line, such as those typically referred to as digit (e.g., bit) lines. In NAND flash architecture, a string of memory cells is coupled in series with only the first memory cell of the string coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Programming in memories is typically accomplished by applying a plurality of programming pulses, separated by verify pulses, to program each memory cell of a selected group of memory cells to a respective target data state (which may be an interim or final data state). With such a scheme, the programming pulses are applied to access lines, such as those typically referred to as word lines, for selected cells. After each programming pulse, a verify pulse of plurality of verify pulses are used to verify the programming of the selected cells. Current programming uses many programming pulses in an incremental step pulse programming scheme, where each programming pulse is a single pulse that moves cell threshold voltage by a certain amount. In a four level MLC, there are four potential final data states. Before each programming pulse, word lines are precharged, and after each programming pulse, the word lines are discharged. This uses high voltage, which is at a premium as memory supply voltages shrink, and consumes power and time.

For the reasons stated above and for other reasons that will become apparent to those skilled in the art upon reading and understanding the present specification, there is a need in the art for improved programming in memories.

DETAILED DESCRIPTION

Figure 1:
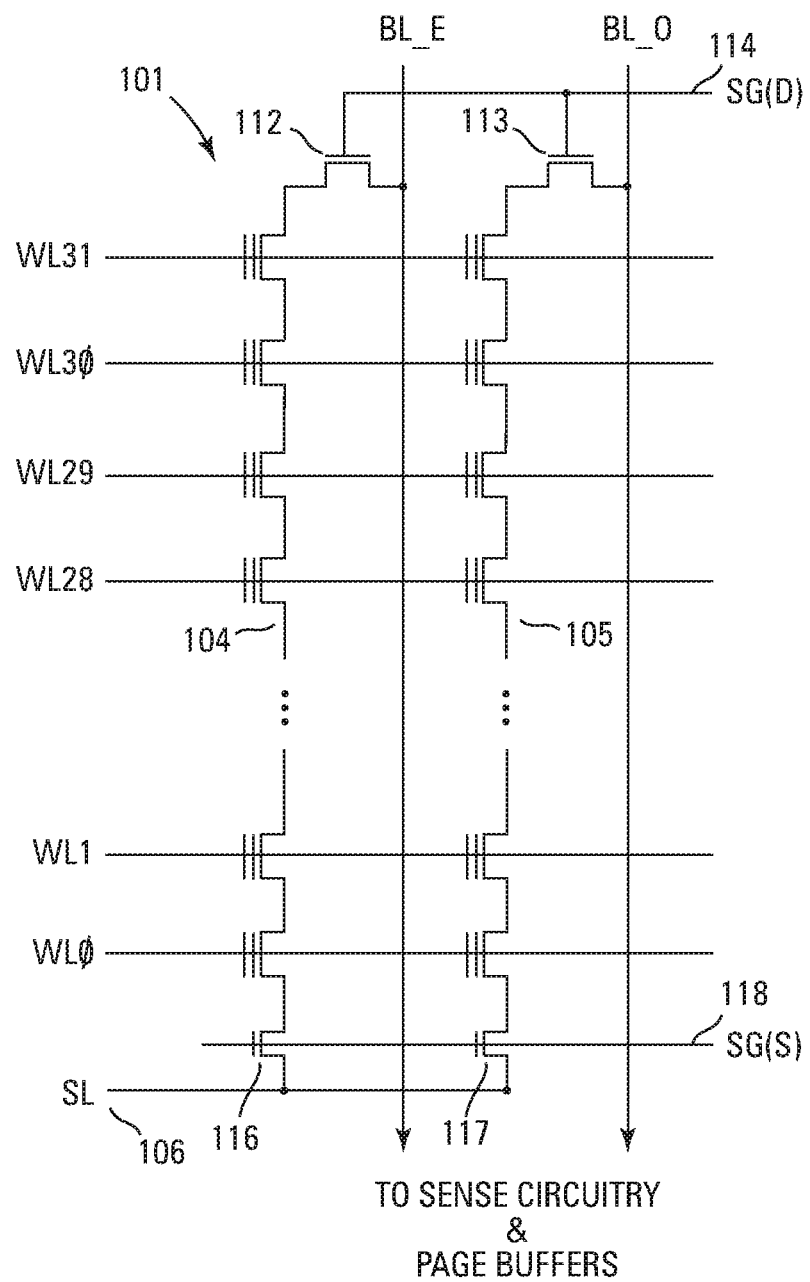
FIG. 1 is a schematic diagram of one embodiment of a portion of a NAND architecture memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Non-volatile memory can utilize different architectures including NOR and NAND. The architecture designation is derived from the logic used to read the devices. In NOR architecture, a logical column of memory cells is coupled in parallel with each memory cell coupled to a data line, such as those typically referred to as bit lines. In NAND architecture, a column of memory cells is coupled in series with only the first memory cell of the column coupled to a bit line.

FIG. 1 illustrates a schematic diagram of one embodiment of a portion of a NAND architecture memory array 101 comprising series strings of non-volatile memory cells.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry that detect and store the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Figure 2:
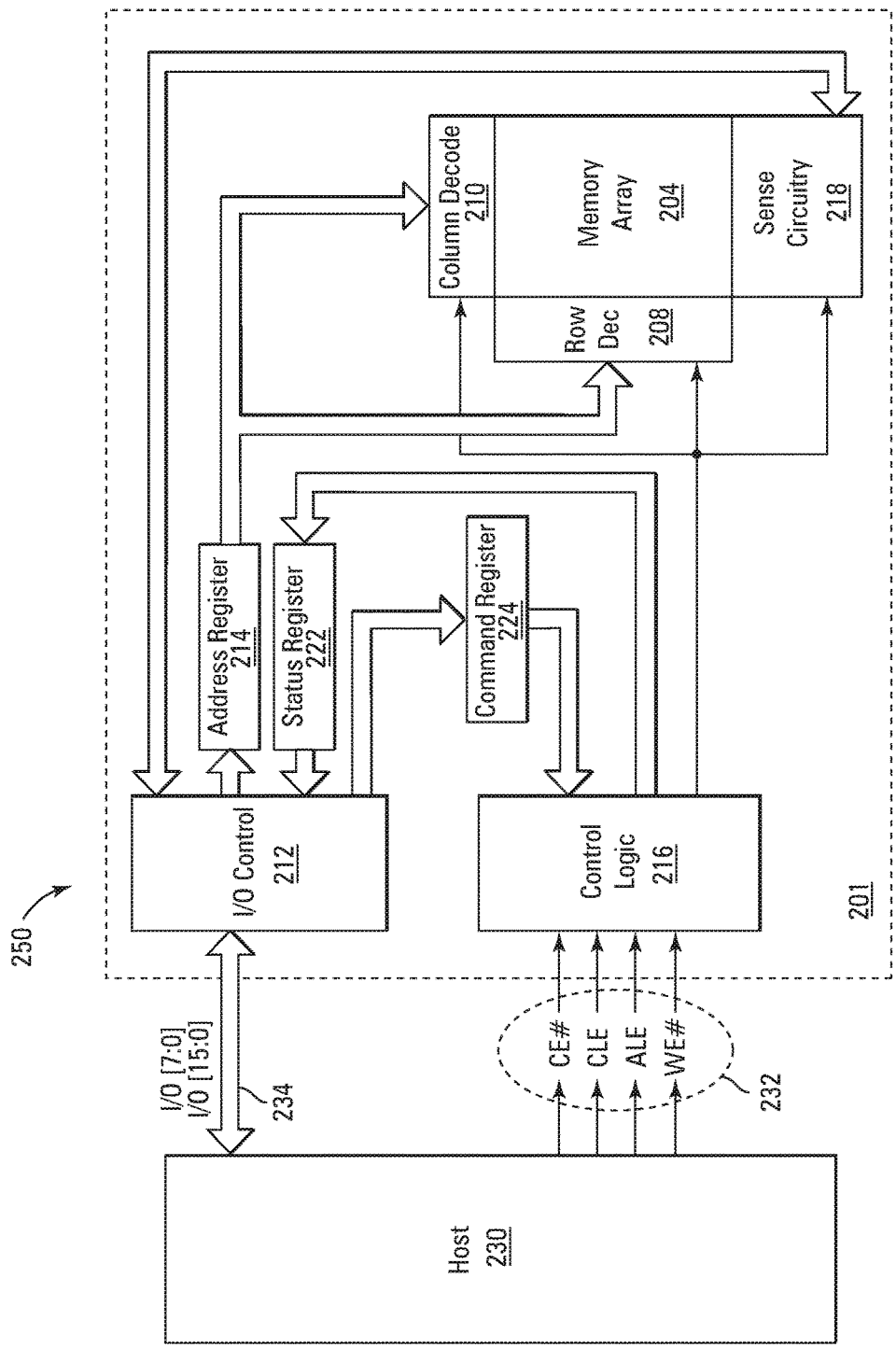
FIG. 2 is a block schematic of an electronic system in accordance with an embodiment of the disclosure.

FIG. 2 is a simplified block diagram of a memory device 201 according to an embodiment of the disclosure, and on which various embodiments of the disclosure can be practiced. Memory device 201 includes an array of memory cells 204 arranged in rows and columns. Although the various embodiments will be described primarily with reference to NAND memory arrays, the various embodiments are not limited to a specific architecture of the memory array 204. Some examples of other array architectures suitable for the present embodiments include NOR arrays, AND arrays, and virtual ground arrays. Further, the embodiments described herein are amenable for use with SLC and MLC memories without departing from the scope of the disclosure. Also, the methods are applicable for memories which could be read/sensed in analog format.

Row decode circuitry 208 and column decode circuitry 210 are provided to decode address signals provided to the memory device 201. Address signals are received and decoded to access memory array 204. Memory device 201 also includes input/output (I/O) control circuitry 212 to manage input of commands, addresses and data to the memory device 201 as well as output of data and status information from the memory device 201. An address register 214 is coupled between I/O control circuitry 212 and row decode circuitry 208 and column decode circuitry 210 to latch the address signals prior to decoding. A command register 224 is coupled between I/O control circuitry 212 and control logic 216 (which may include the elements and code of host 230) to latch incoming commands. In one embodiment, control logic 216, I/O control circuitry 212 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 216 controls access to the memory array 204 in response to the commands and generates status information for an external host such as a host 230. The control logic 216 is coupled to row decode circuitry 208 and column decode circuitry 210 to control the row decode circuitry 208 and column decode circuitry 210 in response to the received address signals.

A status register 222 is coupled between I/O control circuitry 212 and control logic 216 to latch the status information for output to an external controller.

Memory device 201 receives control signals at control logic 216 over a control link 232. The control signals may include a chip enable CE#, a command latch enable CLE, an address latch enable ALE, and a write enable WE#. Memory device 201 may receive commands (in the form of command signals), addresses (in the form of address signals), and data (in the form of data signals) from an external controller over a multiplexed input/output (I/O) bus 234 and output data to an external controller over I/O bus 234. I/O bus 234 is also used in one embodiment to signal physically to the host 230 that housekeeping is indicated.

In a specific example, commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data may be received over input/output (I/O) pins [7:0] for a device capable of receiving eight parallel signals, or input/output (I/O) pins [15:0] for a device capable of receiving sixteen parallel signals, at I/O control circuitry 212 and are transferred to sense circuitry (e.g., sense amplifiers and page buffers) 218. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 2 has been simplified to help focus on the embodiments of the disclosure.

Additionally, while the memory device of FIG. 2 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 234. Because the data signals represent bit patterns instead of individual bits, serial communication of an 8-bit data signal could be as efficient as parallel communication of eight signals representing individual bits.

Methods for programming may be performed in various embodiments on a memory such as memory device 201. Such methods are shown and described herein with reference to FIGS. 3-9.

Figure 3:
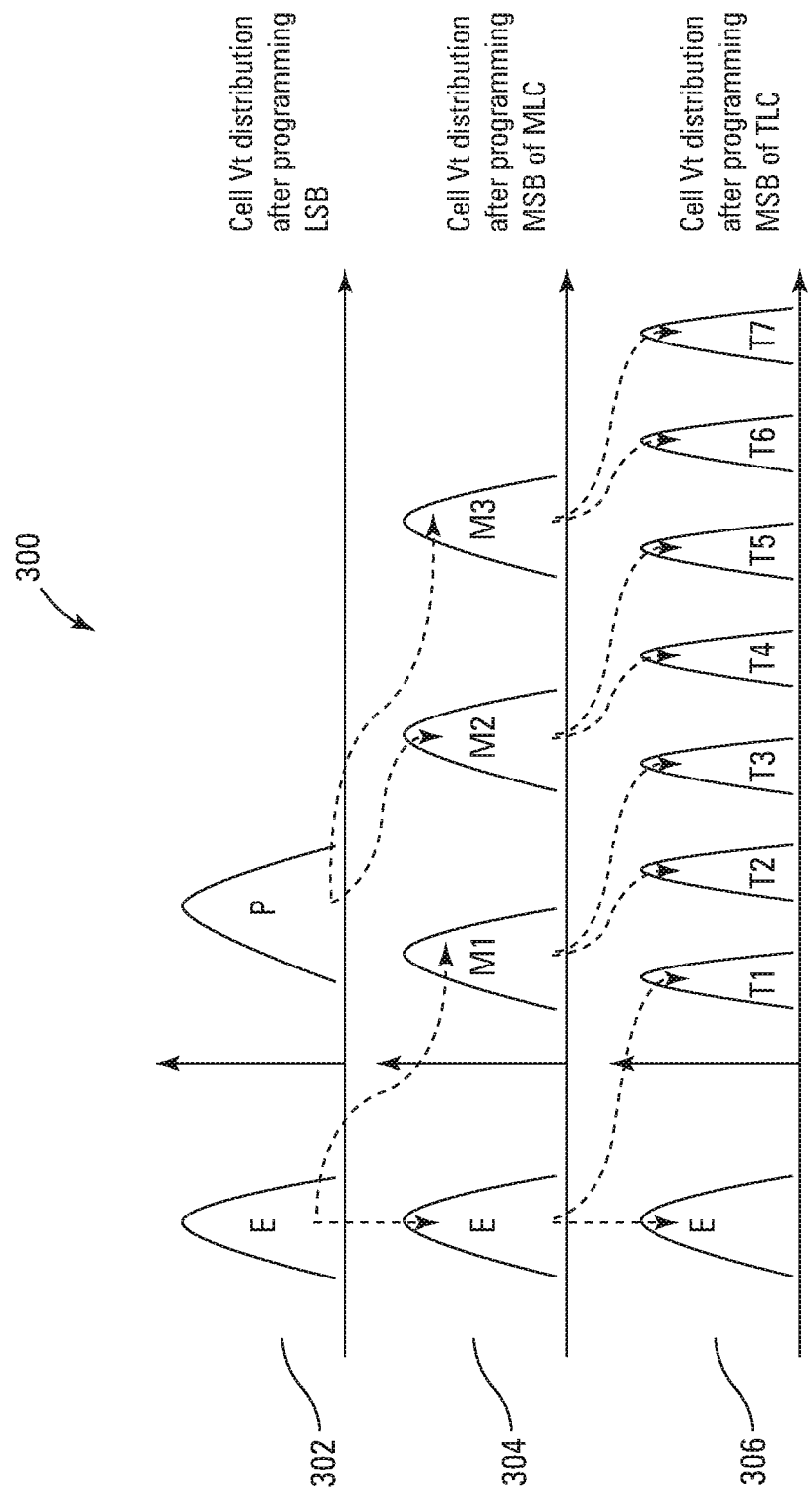
FIG. 3 is a diagram of typical data states for different types of memory cells.

FIG. 3 shows a distribution 302 showing two data states E and P (which may correspond to two final data states in a distribution of SLC cells or two intermediate data states in a distribution of MLC cells, such as after LSB programming). Distribution 304 shows four data states E, M1, M2 and M3 (which may correspond to four final data states in a distribution of two-level MLC cells or four intermediate data states in a distribution of higher level MLC cells). Distribution 306 shows eight data states E, T1, T2, T3, T4, T5, T6, T7 (which might correspond to eight final data states in a distribution of three-level MLC cells, such as after MSB programming). In the illustrated distributions, data state E corresponds to an "erased" data state (even though the cells in data state E may have received some "soft" programming after having been erased, as is performed in some algorithms, for purposes of this application they are still considered to be in an erased data state). Meanwhile, data states P, M1-M3 and T1-T7 correspond to "programmed" data states.

Figure 4:
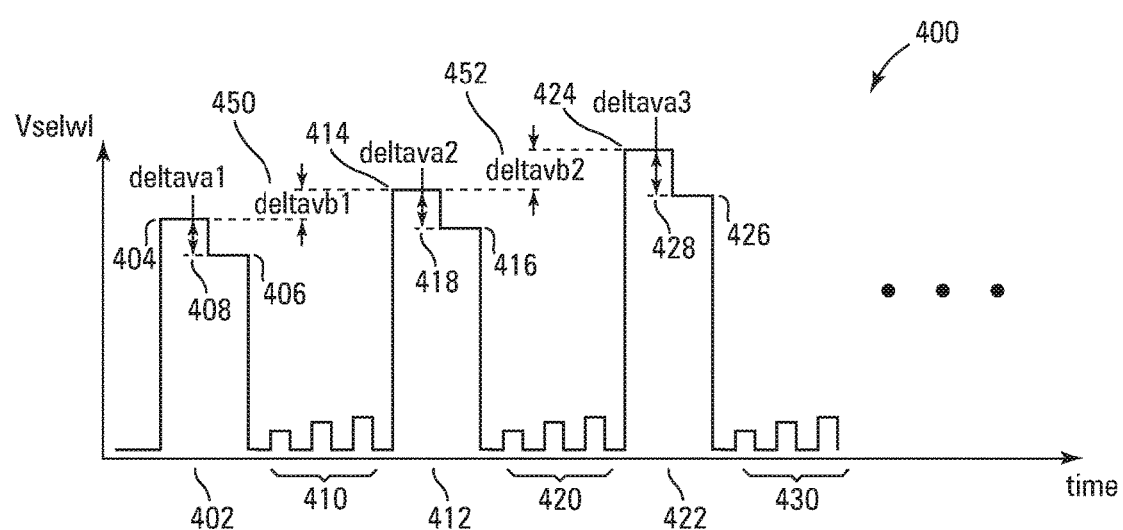
FIG. 4 is a diagram of a programming operation according to one embodiment of the present disclosure.

One embodiment 400 for programming an MLC is shown in FIG. 4. In this embodiment, each programming pulse 402, 412, 422, . . . , of a plurality of programming pulses has two voltage levels, starting at a first higher level 404, 414, 424, . . . , and stepping down to a second lower level 406, 416, 426, . . . . In one embodiment, the amount the multi-step pulses step down is 408, 418, and 428 for pulses 402, 412, and 422, respectively. The step-down amounts 408, 418, and 428 are device specific, and are chosen in one embodiment for the threshold voltage difference between data states. After each multi-step programming pulse, a plurality of verify pulses 410, 420, 430, . . . , are used to determine whether selected cells have reached their target data states. For further programming, the starting voltage for a next multi-step programming pulse is increased by an amount (450, 452) over the starting voltage of the previous multi-step programming pulse in one embodiment.

Figure 5:
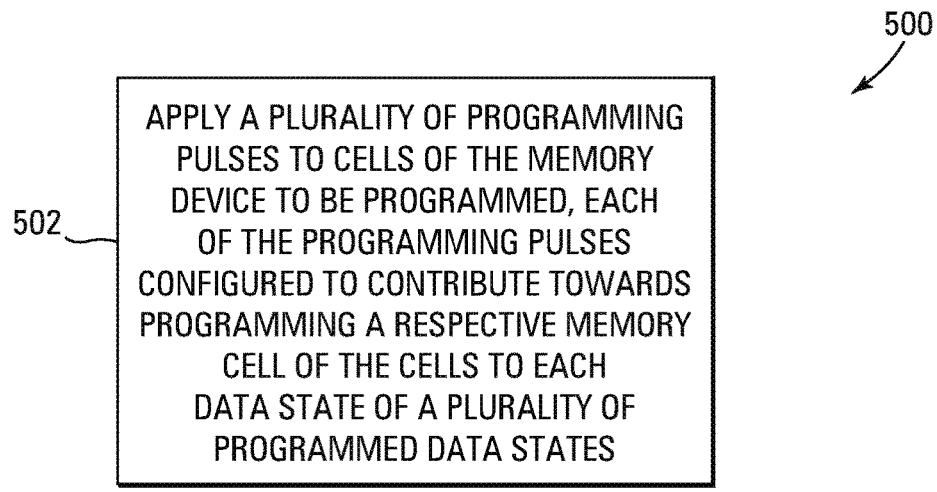
FIG. 5 is a flow chart diagram of a method according to one embodiment of the present disclosure.

In operation, and as shown in flow chart form in FIG. 5, programming 500 comprises applying a plurality of programming pulses to cells of the memory device to be programmed in block 502. Each of the plurality of programming pulses is configured to contribute towards programming a respective memory cell of the cells to each data state of a plurality of programmed data states. This is accomplished in one embodiment by providing a multi-step programming pulse. In one embodiment, each step of each of the plurality of programming pulses steps from a higher voltage to a lower voltage, and each step is configured to contribute towards programming a memory cell to at least one of the programmed data states. A single step down may be used, but additional steps may also be used.

For the portion of a multi-step programming pulse that is configured to contribute towards programming a memory cell(s) to a particular one (or more) of the programmed data states, the memory cells targeted for programming to one of the other programmed data states (that receive the programming pulse) are inhibited from programming. In at least one embodiment, cells being programmed to a data state associated with a higher threshold voltage level are inhibited differently than cells being programmed to a data state associated with a lower threshold voltage level. For example, a first portion of a multi-step pulse (e.g., portions corresponding to pulse levels 404, 414, 424), may be configured to contribute towards programming cells having a target data state of M2 or M3 while cells having a target data state of E or M1 are inhibited. Inhibiting the programming of cells having a target data state of E or M1 is accomplished in one embodiment by boosting channel voltages for those cells. A second portion of a multi-step pulse (e.g., portions corresponding to pulse levels 406, 416, 426), may be configured to contribute towards programming cells having a target data state of M1 while cells having a target data state of E, M2 or M3 are inhibited. Inhibiting the programming of cells having a target data state of E is again accomplished in one embodiment by boosting channel voltages for those cells. Inhibiting the programming of cells having a target data state of M2 or M3 is accomplished in one embodiment by reducing gate voltages (e.g., word line voltage) while boosting data line and channel voltages (e.g., to supply voltage, Vcc, minus Vth) for those cells.

Figure 6:
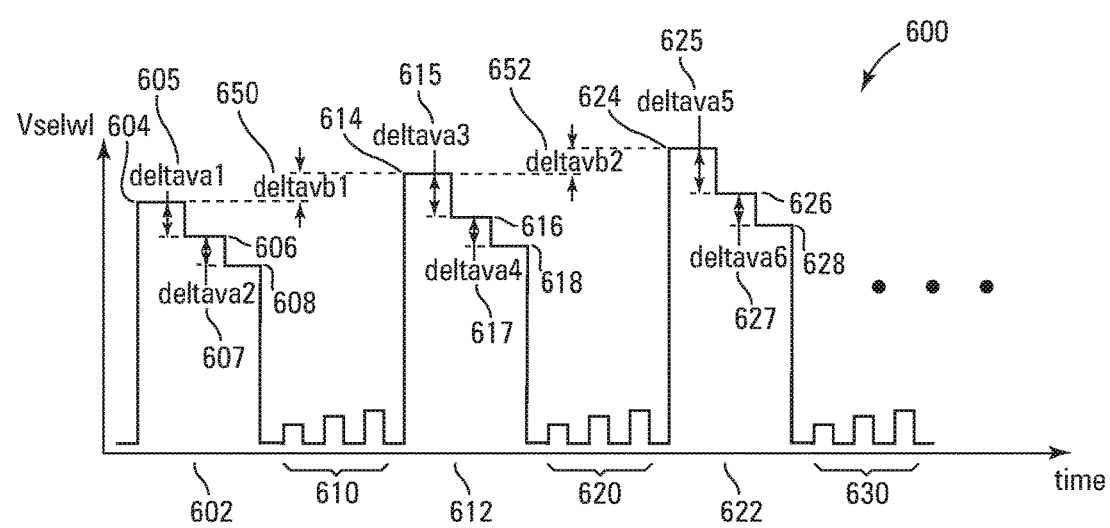
FIG. 6 is a diagram of a programming operation according to another embodiment of the present disclosure.

FIG. 6 shows one embodiment 600 of a different number of steps of a multi-step pulse being to program a memory cell(s) to one of four target data states: E, M1, M2 or M3. In this embodiment, each programming pulse 602, 612, 622, . . . , of a plurality of programming pulses has three voltage levels, starting at a first higher level 604, 614, 624, . . . , stepping down to a second level 606, 616, 626, . . . , and to a third level 608, 618, 628, . . . . In one embodiment, the amount the multi-step pulses step down from the first level to the second level is 605, 615, 625, . . . , and the amount the multi-step pulses step down from the second level to the third level is 607, 617, 627, . . . , for pulses 602, 612, and 622, respectively. The step-down amounts are device specific, and are chosen in one embodiment for the threshold voltage difference between data states. After each multi-step programming pulse, a plurality of verify pulses 610, 620, 630, . . . , are used to determine whether selected cells have reached their target data states. For further programming, the starting voltage for a next multi-step programming pulse is increased by an amount (650, 652) over the starting voltage of the previous multi-step programming pulse in one embodiment. Pulse portions corresponding to pulse levels 604, 614, and 624 may be configured to contribute towards programming cells having a target data state of M3 while cells having a target data state of E, M1 or M2 are inhibited. Pulse portions corresponding to pulse levels 606, 616, and 626 may be configured to contribute towards programming cells having a target data state of M2 while cells having a target data state of E, M1 or M3 are inhibited. Pulse portions corresponding to pulse levels 608, 618, and 628 may be configured to contribute towards programming cells having a target data state of M1 while cells having a target data state of E, M2 or M3 are inhibited.

Figure 7:
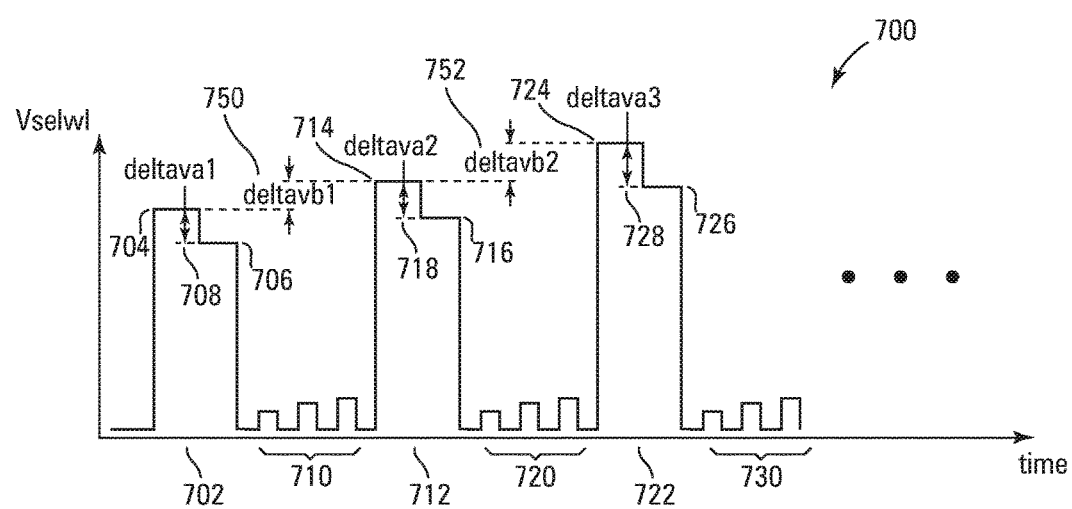
FIG. 7 is a diagram of a programming operation according to another embodiment of the present disclosure.

One embodiment 700 for programming a three level cell (TLC) is shown in FIG. 7. In this embodiment, each programming pulse 702, 712, 7422, . . . , of a plurality of programming pulses has two voltage levels, starting at a first higher level 704, 714, 724, . . . , and stepping down to a second lower level 706, 716, 726, . . . . In one embodiment, the amount the multi-step pulses step down is 708, 718, 728, . . . , for pulses 702, 712, and 722, respectively. The step-down amounts 708, 718, and 728 are device specific, and are chosen in one embodiment for the threshold voltage difference between data states. After each multi-step programming pulse, a plurality of verify pulses 710, 720, 730, . . . , are used to determine whether selected cells have reached their target data states. For further programming, the starting voltage for a next multi-step programming pulse is increased by an amount (750, 752) over the starting voltage of the previous multi-step programming pulse in one embodiment. The first portion of each multi-step pulse (e.g., portions corresponding to pulse levels 704, 714, 724) in this embodiment may be configured to contribute towards programming cells having a target data state in an upper half of the target data states (e.g., T4-T7) while cells having a target data state in a lower half of the target data states (e.g., E and T1-T3) are inhibited from programming, and the second portion of each multi-step pulse (e.g., portions corresponding to pulse levels 706, 716, 726) may be configured to contribute towards programming cells having a target data state in the lower half of the target data states (e.g., E and T1-T3), while cells having a target data state in the upper half of the target data states (e.g., T4-T7) are inhibited from programming.

Figure 8:
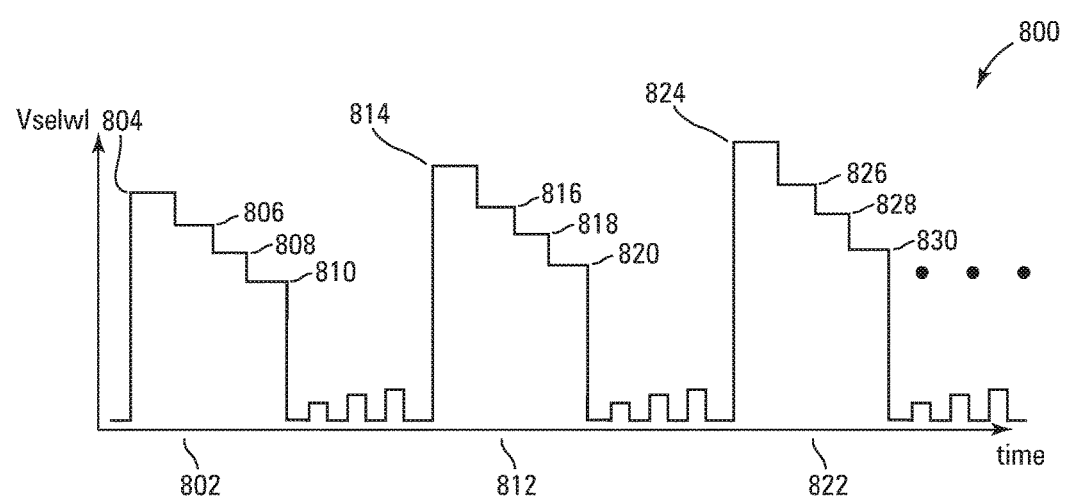
FIG. 8 is a diagram of a programming operation according to another embodiment of the present disclosure.

FIG. 8 shows one embodiment 800 of a different number of steps of a multi-step pulse being used to program a memory cell(s) to one of eight target data states: E, T1, T2, T3, T4, T5, T6 or T7). In this embodiment, each programming pulse 802, 812, 822, . . . , of a plurality of programming pulses has four voltage levels, starting at a first level 804, 814, 824, . . . , stepping down to a second level 806, 816, 826, . . . , to a third level 808, 818, 828, . . . , and to a fourth level 810, 820, 830. The step-down amounts, as described above, are device specific, and are chosen in one embodiment for the threshold voltage difference between data states. After each multi-step programming pulse, a plurality of verify pulses are used to determine whether selected cells have reached their targeted data states. For further programming, the starting voltage for a next multi-step programming pulse is increased by an amount (not shown) over the starting voltage of the previous multi-step programming pulse in one embodiment, all similarly to that shown above with respect to FIGS. 4, 6, and 7.

Figure 9:
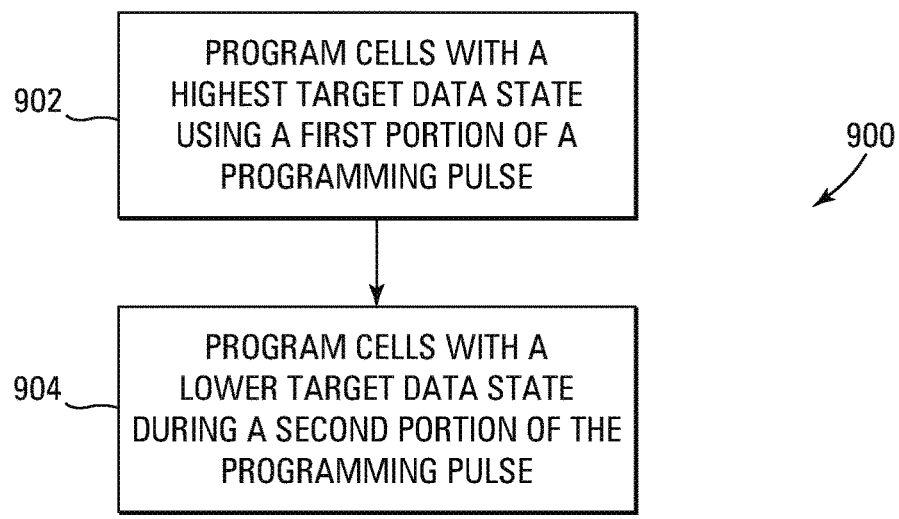
FIG. 9 is a flow chart diagram of a method according to another embodiment of the present disclosure.

Another method 900 for programming a multi-level cell is shown in FIG. 9. Method 900 comprises programming cells with a highest target data state (e.g., the data state associated with the highest threshold voltage level) using a first portion of a programming pulse in block 902, and after programming cells with a highest target data state in the first portion of the programming pulse, programming cells with a lower target data state during a second portion of the programming pulse in block 904. It should be understood that more than two levels may be used, as shown above with respect to FIGS. 5 and 8, without departing from the scope of the disclosure.

Figure 10:
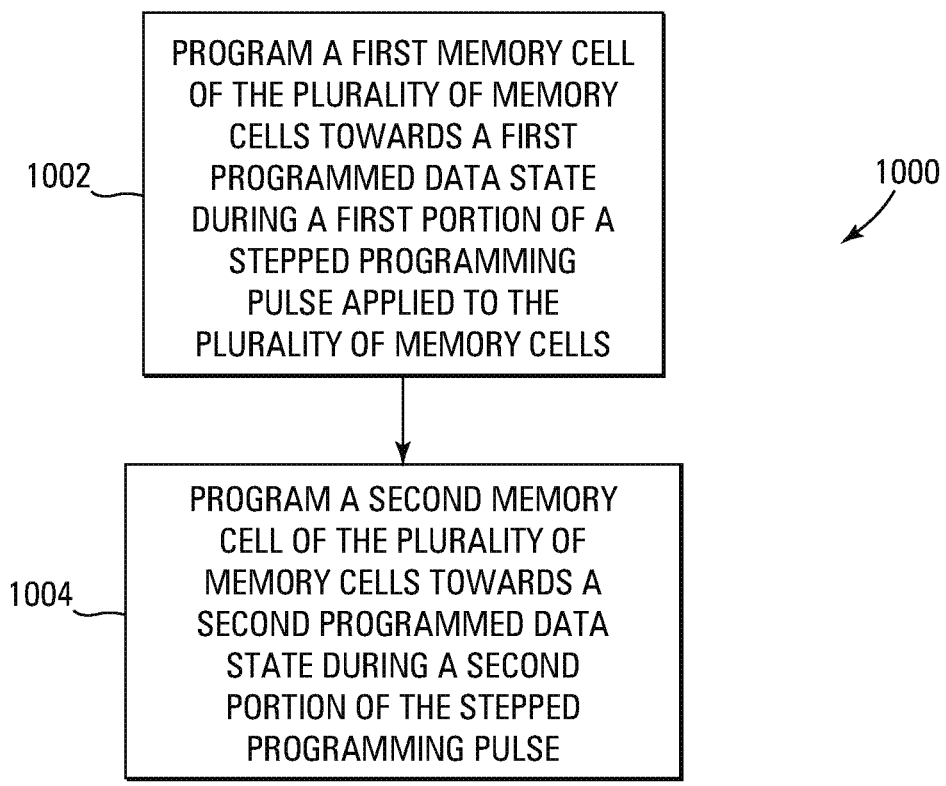
FIG. 10 is a flow chart diagram of a method according to another embodiment of the present disclosure.

Another method 1000 of programming a plurality of memory cells is shown in FIG. 10. Method 1000 comprises, in one embodiment, programming a first memory cell of the plurality of memory cells towards a first programmed data state (e.g., M2 or M3 as shown in FIG. 4; M3 as shown in FIG. 6; T4, T5, T6 or T7 as shown in FIG. 7; and T6 or T7 as shown in FIG. 8) during a first portion of a stepped programming pulse applied to the plurality of memory cells in block 1002, and programming a second memory cell of the plurality of memory cells towards a second programmed data state (e.g., M1 as shown in FIG. 4; M2 as shown in FIG. 6; T1, T2 or T3 as shown in FIG. 7; and T4 or T5 as shown in FIG. 8) during a second portion of the stepped programming pulse in block 1004.

Programming a first memory cell of the plurality of memory cells towards a first programmed data state during a first portion of a stepped programming pulse comprises in one embodiment programming a first number of memory cells of the plurality of memory cells towards the first programmed data state during the first portion of the stepped programming pulse, programming a second memory cell of the plurality of memory cells towards a second programmed data state during a second portion of the stepped programming pulse comprises programming a second number of memory cells of the plurality of memory cells towards the second programmed data state during the second portion of the stepped programming pulse. The stepped programming pulse is in one embodiment applied to an access line coupled to the plurality of memory cells.

Figure 11:
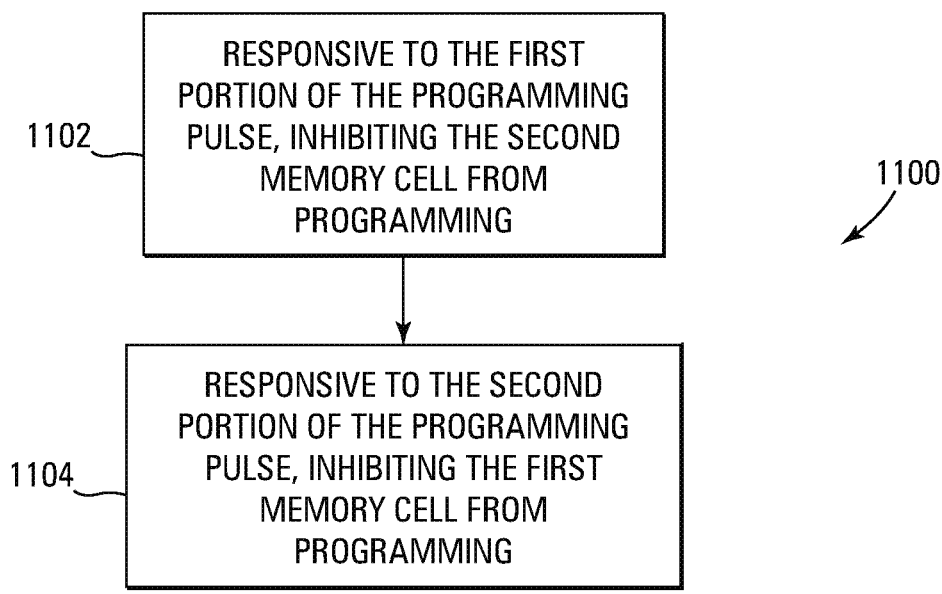
FIG. 11 is a flow chart diagram of a method according to another embodiment of the present disclosure.

In one embodiment, shown in FIG. 11, responsive to the first portion of the programming pulse, the second memory cell is inhibited from programming in block 1102, and responsive to the second portion of the programming pulse, the first memory cell is inhibited from programming in block 1104. The portions of the programming pulse are at different voltage levels, and in one embodiment the second voltage level is lower than the first voltage level. The first programmed data state is associated with a threshold voltage level that is higher than a threshold voltage level associated with the second programmed data state.

Figure 12:
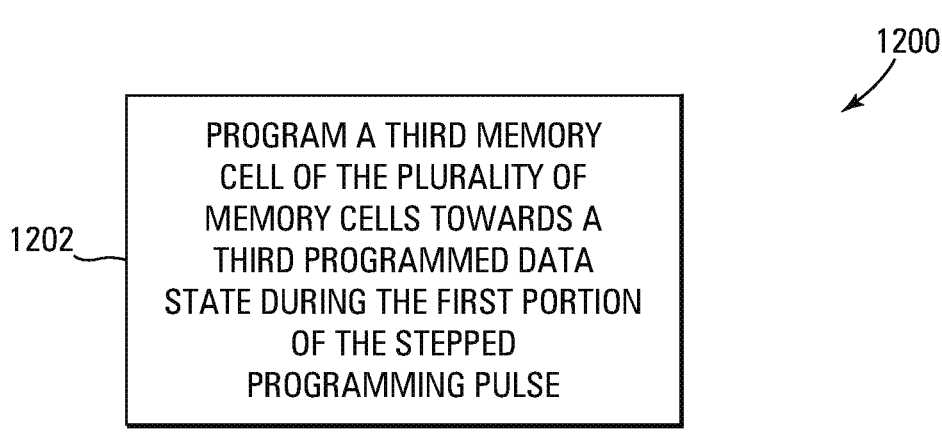
FIG. 12 is a flow chart diagram of a method according to another embodiment of the present disclosure.

The method 1000 may further comprise in an embodiment 1200 shown in FIG. 12, programming a third memory cell of the plurality of memory cells towards a third programmed data state (e.g., M3 as shown in FIG. 4; T5, T6 or T7 as shown in FIG. 7; and T7 as shown in FIG. 8) during the first portion of the stepped programming pulse in block 1202. The third programmed data state is in one embodiment associated with a threshold voltage level that is higher than the threshold voltage level associated with the second programmed data state.

Figure 13:
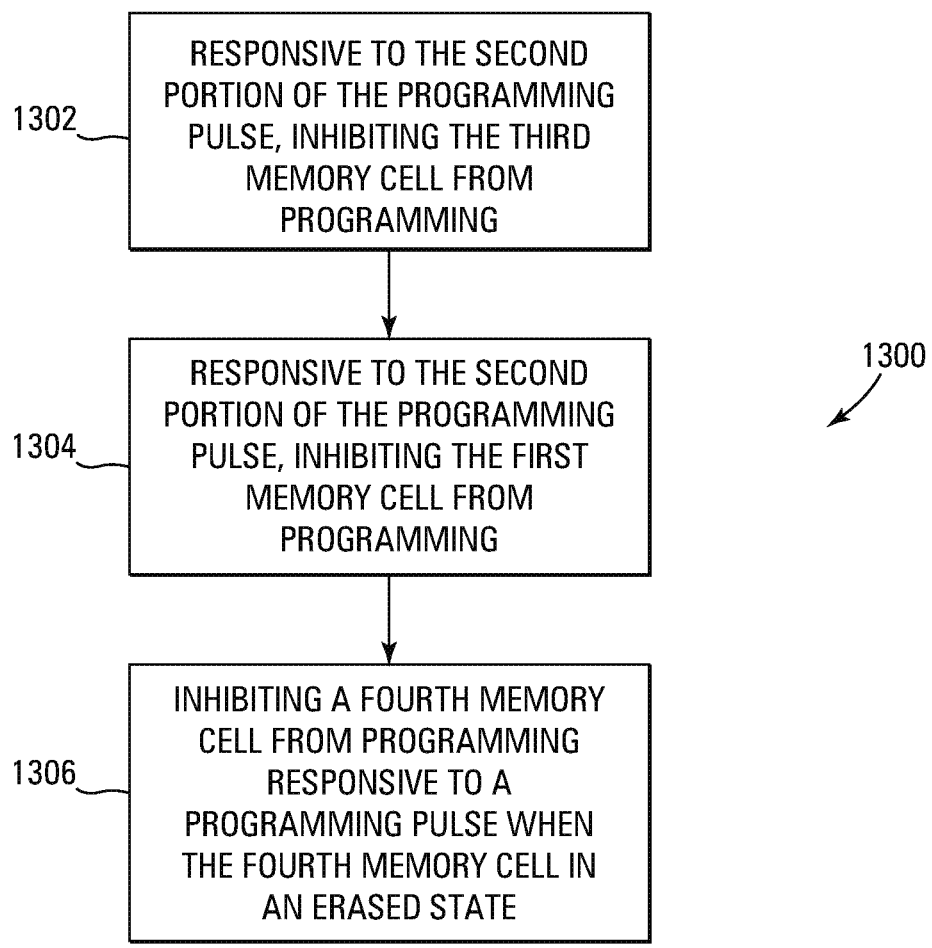
FIG. 13 is a flow chart diagram of a method according to another embodiment of the present disclosure.

In one embodiment 1300, shown in FIG. 13, the method 1200 further comprises, responsive to the second portion of the programming pulse, inhibiting the third memory cell from programming in block 1302, and responsive to the second portion of the programming pulse, inhibiting the first memory cell from programming in block 1304. A fourth memory cell is in this embodiment inhibited in block 1306 from programming responsive to a programming pulse when the fourth memory cell is in an erased state. Inhibiting the second memory cell from programming responsive to the first portion of the programming pulse comprises in one embodiment boosting a channel voltage of the second memory cell during the first portion of the programming pulse. Inhibiting the first and third memory cells from programming responsive to the second portion of the programming pulse comprises in one embodiment reducing a voltage level of the stepped programming pulse and increasing channel voltages of the first and third memory cells during the second portion of the programming pulse. Inhibiting the fourth memory cell from programming responsive to the programming pulse comprises in one embodiment boosting a channel voltage of the fourth memory cell.

Figure 14:
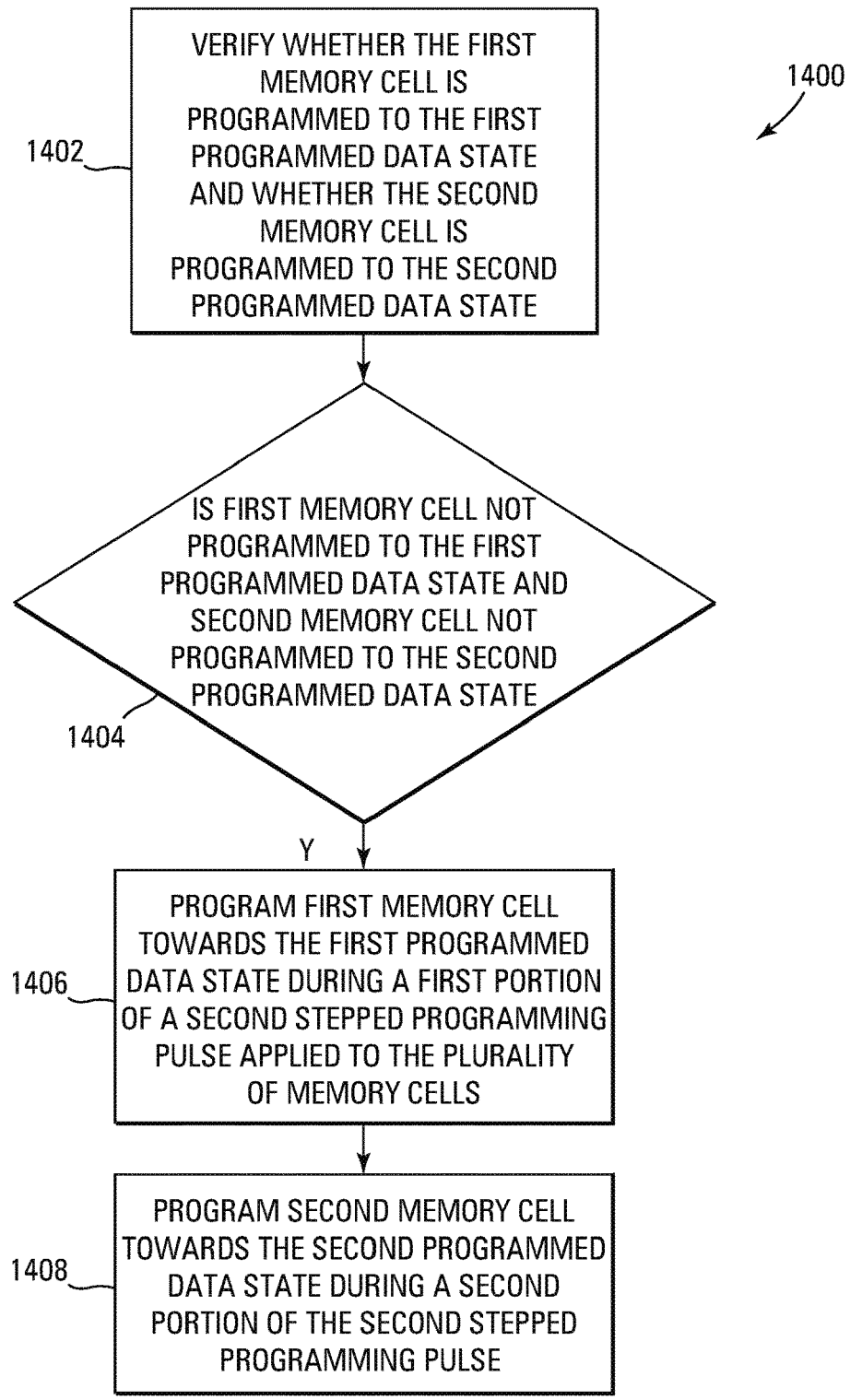
FIG. 14 is a flow chart diagram of a method according to another embodiment of the present disclosure.

The method 1000 may also include, in an embodiment 1400 shown in FIG. 14, verifying whether the first memory cell is programmed to the first programmed data state and whether the second memory cell is programmed to the second programmed data state in block 1402. It is determined in decision block 1404 if the first memory cell is not programmed to the first programmed data state and if the second memory cell is not programmed to the second programmed data state. If that is true, the first memory cell is programmed towards the first programmed data state during a first portion of a second stepped programming pulse applied to the plurality of memory cells in block 1406, and the second memory cell is programmed towards the second programmed data state during a second portion of the second stepped programming pulse in block 1408.

Figure 15:
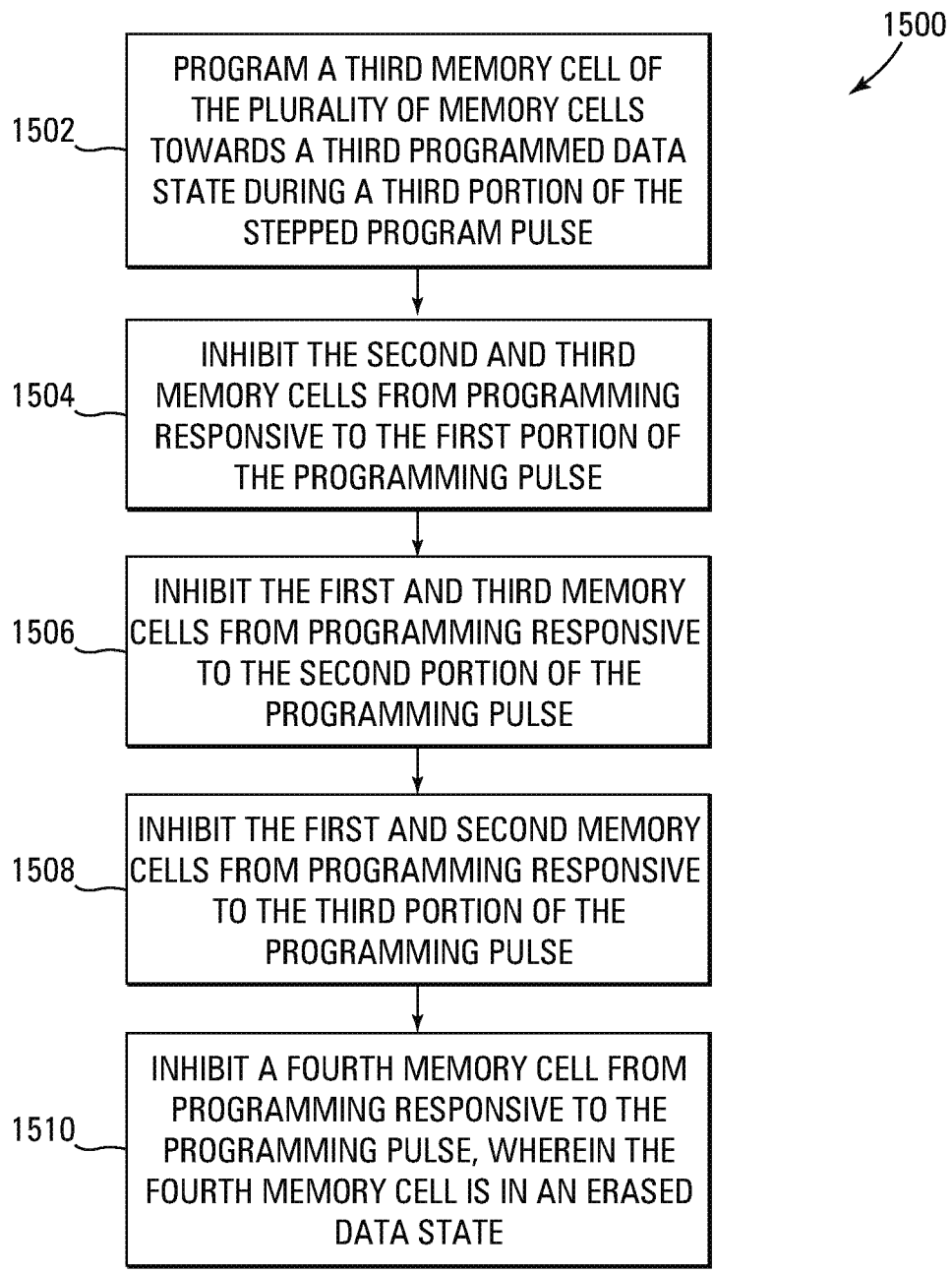
FIG. 15 is a flow chart diagram of a method according to another embodiment of the present disclosure.

The method 1000 may also comprise, in embodiment 1500 shown in FIG. 15, programming a third memory cell of the plurality of memory cells towards a third programmed data state (e.g., M1 as shown in FIG. 6; and T2 or T3 as shown in FIG. 8) during a third portion of the stepped programming pulse in block 1502. The programming pulse in this embodiment has a first voltage level during the first portion of the programming pulse, a second voltage level during the second portion of the programming pulse, and a third voltage level during the third portion of the programming pulse, wherein the third voltage level is lower than the second voltage level, wherein the second voltage level is lower than the first voltage level, wherein the first programmed data state is associated with a threshold voltage level that is higher than a threshold voltage level associated with the second programmed data state, and wherein the threshold voltage level associated with the second programmed data state is higher than a threshold voltage level associated with the third programmed data state.

The method of this embodiment may further comprise inhibiting the second and third memory cells from programming responsive to the first portion of the programming pulse in block 1504, inhibiting the first and third memory cells from programming responsive to the second portion of the programming pulse in block 1506, inhibiting the first and second memory cells from programming responsive to the third portion of the programming pulse in block 1508, and inhibiting a fourth memory cell from programming responsive to the programming pulse, wherein the fourth memory cell is in an erased data state in block 1510.

Inhibiting the second and third memory cells from programming responsive to the first portion of the programming pulse comprises boosting channel voltages of the second and third memory cells during the first portion of the programming pulse. Inhibiting the first and third memory cells from programming responsive to the second portion of the programming pulse comprises reducing a voltage level of the stepped programming pulse and increasing a channel voltage of the first memory cell during the second portion of the programming pulse, and boosting a channel voltage of the third memory cell during the second portion of the programming pulse. Inhibiting the first and second memory cells from programming responsive to the third portion of the programming pulse comprises reducing the voltage level of the stepped programming pulse and increasing channel voltages of the first and second memory cells during the third portion of the programming pulse. Inhibiting the fourth memory cell from programming responsive to the programming pulse comprises boosting a channel voltage of the fourth memory cell.

In this embodiment, the method may further comprise programming a fourth memory cell of the plurality of memory cells towards a fourth programmed data state (e.g., T1) during a fourth portion of the stepped programming pulse, programming a fifth memory cell of the plurality of memory cells towards a fifth programmed data state (e.g., T3) during the third portion of the stepped programming pulse, programming a sixth memory cell of the plurality of memory cells towards a sixth programmed data state (e.g., T5) during the second portion of the stepped programming pulse, and programming a seventh memory cell of the plurality of memory cells towards a seventh programmed data state (e.g., T7) during the first portion of the stepped programming pulse.

Figure 16:
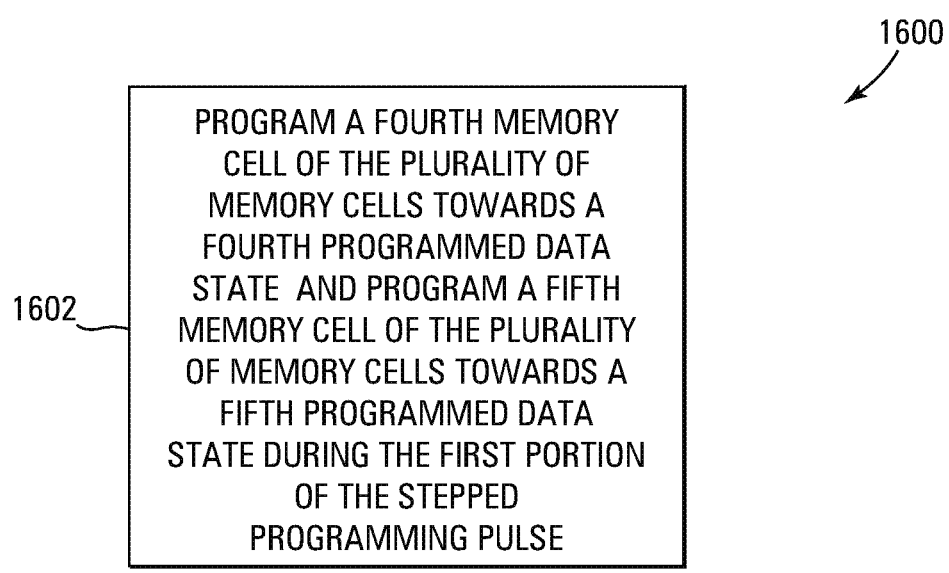
FIG. 16 is a flow chart diagram of a method according to another embodiment of the present disclosure.

The method 1200 may further comprise, in one embodiment 1600 shown in FIG. 16, programming a fourth memory cell of the plurality of memory cells towards a fourth programmed data state (FIG. 7->T6) and programming a fifth memory cell of the plurality of memory cells towards a fifth programmed data state (FIG. 7->T7) during the first portion of the stepped programming pulse in block 1602. The fourth programmed data state is associated with a threshold voltage level that is higher than the threshold voltage level associated with the third programmed data state, and the fifth programmed data state is associated with a threshold voltage level that is higher than the threshold voltage level associated with the fourth programmed data state.

With the embodiments of the present disclosure, the number of programming pulses used to program a memory is decreased. Further, the amount of power consumed in the programming process is also decreased since programming cells to multiple data states is accomplished without discharging and pumping up word lines between operations targeted towards programming cells having a respective specific target data state.

In a typical programming sequence a number of programming pulses for four-level MLC (four data states) is determined to be:

$$[(VgVtmax+M3Vt)-(VgVtmin+M1Vt)]/\text{step size}$$

where VgVt is the word line voltage–the threshold voltage, in one embodiment 20 Volts to program to a Vt of 4 Volts, making then VgVt=16. VgVtmax is the largest difference between word line voltage and desired threshold voltage, and VgVtmin is the smallest difference between word line voltage and desired threshold voltage.

The embodiments of the present disclosure may also reduce the amount of program disturb seen by M1 cells during programming of M2 and M3 cells, since M1 cells are programmed after M2 and M3 cells. Also, overall program disturb may be reduced since fewer program pulses and a shorter program time are used. Further, overall cell-to-cell coupling along a same word line may be reduced since cells targeted for programming are programmed together regardless of their targeted data state.

CONCLUSION

In summary, one or more embodiments of the disclosure show cells targeted for programming being programmed during each programming pulse. This is accomplished in one embodiment using a multi-step programming pulse that programs cells having a higher target data state with a first portion of the programming pulse and that contributes towards programming cells having a lower target data state during a second portion of the programming pulse.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, comprising:
    applying a programming pulse to a plurality of memory cells selected for programming, wherein the programming pulse comprises an initial portion having a first voltage level and a subsequent portion having a second voltage level less than the first voltage level;
    inhibiting a particular memory cell of the plurality of memory cells from programming during the initial portion of the programming pulse while a different memory cell of the plurality of memory cells is enabled for programming; and
    inhibiting the different memory cell from programming during the subsequent portion of the programming pulse while the particular memory cell is enabled for programming.

2. The method of claim 1, wherein inhibiting the particular memory cell from programming comprises inhibiting a memory cell having a desired data state corresponding to a threshold voltage level that is lower than a threshold voltage level corresponding to a desired data state of the different memory cell.

3. The method of claim 1, wherein inhibiting the particular memory cell from programming while the different memory cell is enabled for programming comprises inhibiting the particular memory cell from programming while a plurality of different memory cells are enabled for programming, and wherein a first memory cell of the plurality of different memory cells is enabled for programming to a first data state and a second memory cell of the plurality of different memory cells is enabled for programming to a second data state different than the first data state.

4. The method of claim 1, further comprising:
after applying the programming pulse, verifying whether the particular memory cell and the different memory cell have reached respective desired data states;
wherein the respective desired data state of the different memory cell corresponds to a first threshold voltage level; and
wherein the respective desired data state of the particular memory cell corresponds to a second threshold voltage level less than the first threshold voltage level.

5. The method of claim 4, wherein after applying the programming pulse comprises after applying both the initial portion and the subsequent portion of the programming pulse.

6. The method of claim 1, wherein the programming pulse further comprises a next subsequent portion having a third voltage level less than the second voltage level, the method further comprising:
inhibiting the particular memory cell from programming during the initial portion of the programming pulse while the different memory cell and another memory cell of the plurality of memory cells are enabled for programming; and
inhibiting the different memory cell and the other memory cell from programming during the subsequent portion of the programming pulse while the particular memory cell is enabled programming.

7. The method of claim 1, wherein the programming pulse further comprises a next subsequent portion having a third voltage level less than the second voltage level, the method further comprising:
inhibiting the particular memory cell and the other memory cell from programming during the initial portion of the programming pulse while the different memory cell and is enabled for programming;
inhibiting the different memory cell and the other memory cell from programming during the subsequent portion of the programming pulse while the particular memory cell is enabled programming; and
inhibiting the particular memory cell and the different memory cell from programming during the next subsequent portion of the programming pulse while the other memory cell and is enabled for programming.

8. A method of operating a memory device, comprising:
applying a programming pulse to a plurality of memory cells selected for programming, wherein the programming pulse comprises a plurality of portions, and wherein each portion of the plurality of portions comprises a respective voltage level, and the respective voltage level for any portion of the plurality of portions is different than the respective voltage level for each remaining portion of the plurality of portions;
for each portion of the plurality of portions, inhibiting at least one memory cell of the plurality of memory cells from programming;
for each portion of the plurality of portions, enabling at least one memory cell of the plurality of memory cells for programming;
for a particular portion of the plurality of portions, enabling a particular memory cell of the plurality of memory cells for programming and inhibiting a different memory cell of the plurality of memory cells from programming; and
for a different portion of the plurality of portions immediately subsequent to the particular portion, inhibiting the particular memory cell from programming and inhibiting the different memory cell from programming.

9. The method of claim 8, wherein applying the programming pulse comprises a programming pulse wherein the respective voltage level for any portion of the plurality of portions is higher than the respective voltage level for any subsequent portion of the plurality of portions.

10. The method of claim 8, wherein enabling at least one memory cell of the plurality of memory cells for programming comprises enabling only memory cells of the plurality of memory cells having a same respective desired data state.

11. The method of claim 8, wherein enabling at least one memory cell of the plurality of memory cells for programming comprises enabling only memory cells of the plurality of memory cells having respective desired data states corresponding to a data state of a subset of potential data states for the plurality of memory cells.

12. A method of operating a memory device, comprising:
applying a first programming pulse to a plurality of memory cells selected for programming to respective desired data states of a plurality of data states, wherein the first programming pulse comprises a plurality of portions, wherein each portion of the plurality of portions of the first programming pulse comprises a respective voltage level, and wherein the respective voltage level for any portion of the plurality of portions of the first programming pulse is different than the respective voltage level for each remaining portion of the plurality of portions of the first programming pulse;
for each portion of the plurality of portions of the first programming pulse, and for at least one data state of the plurality of data states corresponding to that portion of the plurality of portions of the first programming pulse:
inhibiting from programming each memory cell of the plurality of memory cells whose respective desired data state is the at least one data state corresponding to that portion of the plurality of portions of the first programming pulse; and
enabling for programming each remaining memory cell of the plurality of memory cells whose respective desired data state is other than the at least one data state corresponding to that portion of the plurality of portions of the first programming pulse and that has not reached its respective desired data state; and
after applying the first programming pulse, verifying whether any memory cells of the plurality of memory cells have reached their respective desired data states.

13. The method of claim 12, further comprising:
applying a second programming pulse to the plurality of memory cells, wherein the second programming pulse comprises a plurality of portions, wherein each portion of the plurality of portions of the second programming pulse comprises a respective voltage level, wherein the respective voltage level for any portion of the plurality of portions of the second programming pulse is different than the respective voltage level for each remaining portion of the plurality of portions of the wherein the respective voltage level for any portion of the plurality of portions of the second programming pulse is programming pulse, and wherein the respective voltage level for any portion of the plurality of portions of the second programming pulse is different than the respective voltage level for a corresponding portion of the plurality of portions of the first programming pulse;

for each portion of the plurality of portions of the second programming pulse, and for at least one data state of the plurality of data states corresponding to that portion of the plurality of portions of the second programming pulse:

inhibiting from programming each memory cell of the plurality of memory cells whose respective desired data state is the at least one data state corresponding to that portion of the plurality of portions of the second programming pulse; and enabling for programming each remaining memory cell of the plurality of memory cells whose respective desired data state is other than the at least one data state corresponding to that portion of the plurality of portions of the second programming pulse and that has not reached its respective desired data state.

14. The method of claim 13, wherein applying the second programming pulse to the plurality of memory cells comprises applying the second programming pulse such that the respective voltage level for any portion of the plurality of portions of the second programming pulse is higher than the respective voltage level for its corresponding portion of the plurality of portions of the first programming pulse.

15. The method of claim 12, wherein verifying whether any memory cells of the plurality of memory cells have reached their respective desired data states comprises applying a plurality of verify pulses to the plurality of memory cells.

16. The method of claim 15, wherein applying the plurality of verify pulses comprises applying a plurality of verify pulses having different voltage levels.

17. The method of claim 15, wherein a number of verify pulses of the plurality of verify pulses is different than a number of portions of the plurality of portions of the first programming pulse.

18. The method of claim 12, wherein, for an initial portion of the plurality of portions of the first programming pulse, enabling for programming each remaining memory cell of the plurality of memory cells whose respective desired data state is other than the at least one data state corresponding to that portion of the plurality of portions of the first programming pulse and that has not reached its respective desired data state comprises enabling for programming a memory cell of the plurality of memory cells whose respective desired data state corresponds to a highest threshold voltage level of the plurality of data states.

19. The method of claim 18, further comprising enabling for programming a memory cell of the plurality of memory cells whose respective desired data state corresponds to a next highest threshold voltage level of the plurality of data states.

20. The method of claim 12, wherein, for an initial portion of the plurality of portions of the first programming pulse, enabling for programming each remaining memory cell of the plurality of memory cells whose respective desired data state is other than the at least one data state corresponding to that portion of the plurality of portions of the first programming pulse and that has not reached its respective desired data state comprises enabling for programming each memory cell of the plurality of memory cells that has not reached its respective desired data state and whose respective desired data state is any data state of the plurality of data states having a corresponding threshold voltage level equal to or higher than a threshold voltage level corresponding to a particular data state of the plurality of data states.

* * * * *